United States Patent [19]

Woolf

[11] Patent Number: 5,140,006

[45] Date of Patent: Aug. 18, 1992

[54] PROCESS FOR NON-DESTRUCTIVE HEAT TREATMENT OF SPOOLED SILVER COATED HIGH TEMPERATURE SUPERCONDUCTOR

[75] Inventor: Lawrence D. Woolf, Carlsbad, Calif.

[73] Assignee: General Atomics, San Diego, Calif.

[21] Appl. No.: 586,414

[22] Filed: Sep. 21, 1990

[51] Int. Cl.$^5$ .............................. B05D 5/12
[52] U.S. Cl. ........................ 505/1; 505/704; 427/62; 427/435; 427/117; 427/118
[58] Field of Search ............ 505/1, 704, 740; 427/62, 63, 435, 117, 118; 118/420; 29/599

[56] References Cited

U.S. PATENT DOCUMENTS 4,929,596  5/1990  Meyer et al. ..................... 505/1
4,959,346  9/1990  Mogro-Campero et al. ....... 505/1

FOREIGN PATENT DOCUMENTS 63-307620  12/1988  Japan ......................... 505/740
64-2220    1/1989   Japan ......................... 505/740

OTHER PUBLICATIONS

Yamada et al., "Bulk and Wire Type Y-Ba-Cu Oxide Superconductor", Jpn. J. Appl. Phys. vol. 26 (1987) Supplement 26-3.
Jin et al., "High Tc Superconductors-composite wire fabrication", Appl. Phys. Lett. 51(3) Jul. 1987 pp. 203-204.
Onuma et al., "Y-Ba-Cu-O Thin Films Formed on Alumina Ceramic Substrates Coated with Yttria Stabilized zirconia Layer", Jpn. J. Appl. Phys. 27(7) Jul. 1988 L351-352.

Primary Examiner—Shrive Beck
Assistant Examiner—Roy V. King
Attorney, Agent, or Firm—Nydegger & Associates

[57] ABSTRACT

A method for heat processing a superconductor wire which has a protective silver cladding includes the steps of attaching the coated wire to a spool and then rotating the spool to wind the wire around the spool in juxtaposed coils. As the wire is being wound around the spool, the portions of the wire which are not yet coiled are drawn through a container which holds a paint that contains a silver diffusion inhibiting material. The diffusion inhibiting material is consequently deposited onto the silver cladding of the superconductor wire, and the coiled wire is subsequently placed in a furnace. The wire is heat processed in the furnace as appropriate for the particular type of superconductor material. The diffusion inhibitor material prevents diffusion of silver during the heat processing between portions of the wire which contact each other.

17 Claims, 1 Drawing Sheet

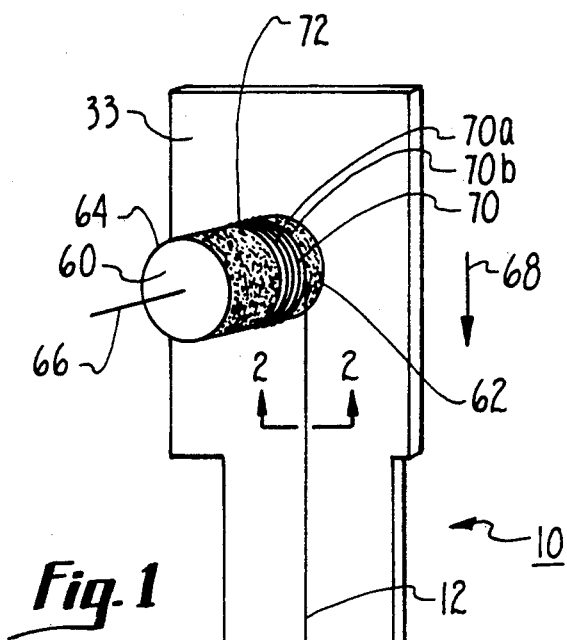
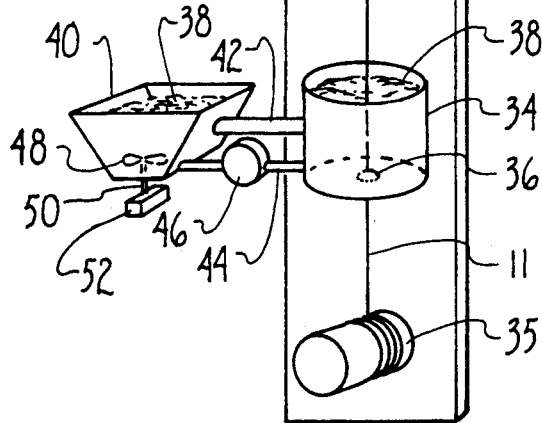
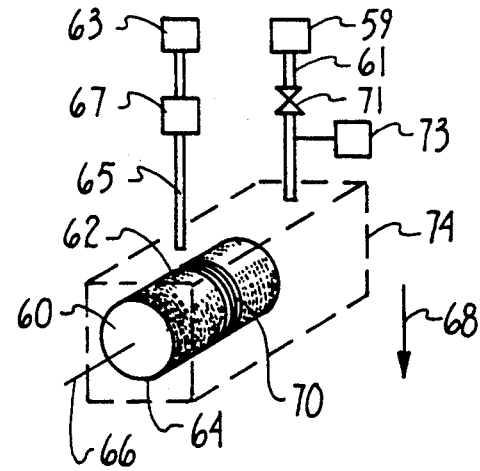
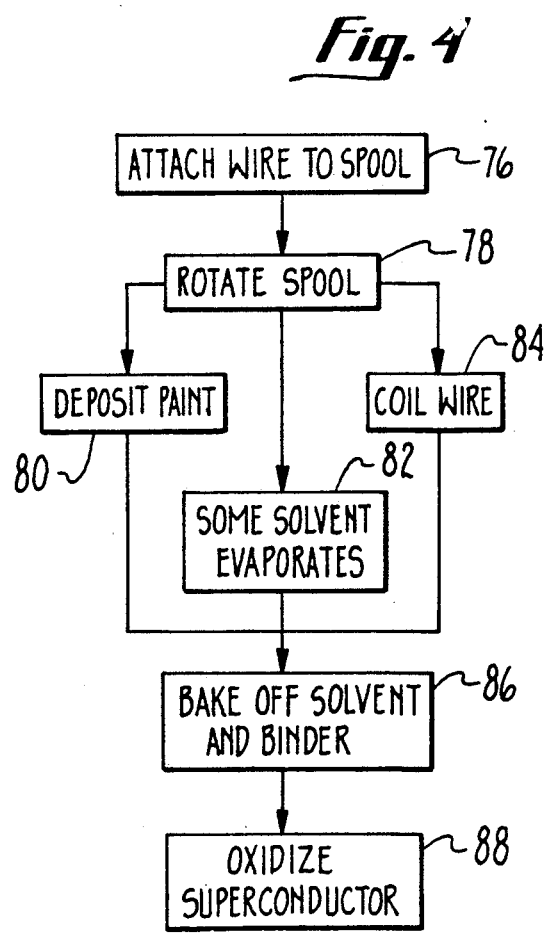

PROCESS FOR NON-DESTRUCTIVE HEAT TREATMENT OF SPOOLED SILVER COATED HIGH TEMPERATURE SUPERCONDUCTOR

FIELD OF THE INVENTION invention relates generally to methods and apparatus for manufacturing superconductor wire. More particularly, the present invention relates to methods and apparatus for manufacturing high transition temperature superconductor wire. The present invention relates particularly, though not exclusively, to methods and apparatus for heat processing and oxygenation of cladded, high transition temperature superconductor wires.

BACKGROUND OF THE INVENTION

In recent years, ceramic superconductors have been developed which retain their superconducting properties at relatively high transition temperatures ($T_c$), i.e. at temperatures above about twenty degrees absolute or 20 Kelvins. Consequently, although modern ceramic superconductors still need to be cooled to be operational, they do not need to be cooled to as low a temperature as the earlier superconductors. The new superconductors can therefore be used in a large number of applications which have not heretofore been economically feasible.

Not surprisingly, many of the potential applications for high-$T_c$ ceramic superconductors require forming the superconductor into a wire configuration. Indeed, wire configurations for superconductor materials have been proposed. For example, a superconductor wire configuration is disclosed in pending application Ser. No. 265,827, now U.S. Pat. No. 5,047,38 for an invention entitled "Substrate for Ceramic Superconductor", which is assigned to the same assignee as the present invention. These wires, however, can be damaged in numerous ways. Thus, to protect the ceramic superconductor wire from contamination by impurities which could adversely affect the superconducting properties of the ceramic, methods have been developed for encasing the superconductor wire in a protective cladding Ideally, the protective cladding is itself electrically conductive, in order to enhance the electrical conductivity of the superconductor wire as well as protect the wire. One method for encasing a superconductor wire in a protective cladding is disclosed in co-pending U.S. patent application for an invention entitled "Anhydrous Electrophoretic Silver Coating Technique" which is assigned to the same assignee as the present invention.

Silver is ordinarily the preferred protective cladding material when the superconductor material is a ceramic, because silver will not readily react with the ceramic superconductor material. This is important because any reaction or interdiffusion of material between the protective cladding and the ceramic superconductor will adversely affect the superconducting properties of the superconductor. Additionally, silver is preferred because silver can establish an effective protective cladding which substantially blocks the diffusion of water, carbon dioxide, and other environmental impurities through the silver cladding and into the ceramic superconductor. Also, silver can form a low contact resistance electrical contact to the high temperature superconductors as well as to normally conductive material such as copper or solder, normally used for electrical current transport. Thus, silver is an ideal bridging material between the superconductor and other conductive materials.

Silver does not, however, prevent the diffusion of oxygen through the protective cladding into the ceramic superconductor. This is desirable, because such oxygen diffusion is necessary in order to properly establish the oxygen content of the superconductor incident to the manufacturing process. To illustrate why it is important to properly establish the oxygen content of the superconductor, consider the familiar 1-2-3 ceramic superconductor which has the chemical formula $YBa_2Cu_3O_{7-x}$, where x has values from zero to one (0-1). For this superconductor, in order to effectively operate as a superconductor at as high a temperature as possible, it is necessary that the superconductor be oxidized after the manufacturing process to establish a value for x that is as close to zero as possible. Specifically, the transition temperature for the 1-2-3 superconductor is about ninety Kelvins (90K) when x is zero, but is substantially reduced when x is greater than 0.3. Accordingly, ceramic 1-2-3 superconductors, including those which have a silver coating, are typically heated for a relatively lengthy period, e.g., several days, to establish an optimum oxygen concentration in the superconductor.

In the manufacture of production lengths of superconductor wire, it will be appreciated that the wire must ordinarily be wound onto a spool to facilitate the economic oxidation of an entire length of wire in a single furnace. When these relatively long production lengths of superconductor wire are wound onto a spool, however, portions of the wire can overlap or contact other portions of the wire. Unfortunately, when the spool of wire is heated in the furnace, e.g., to oxygenate the superconductor in the case of 1-2-3 superconductor, or to sinter the superconductor at elevated temperatures in the case of bismuth-based superconductors, this overlapping contact between portions of the wire allows the silver cladding material from one portion of the wire to diffuse into the silver cladding of other portions of the wire with which it is in contact. This diffusion of silver can not only impair the protective characteristics of the silver cladding, but also prevent an effective unspooling of the oxygenated wire because adjacent portions of the silver cladding can stick together. The present invention recognizes that a method can be provided to substantially prevent the diffusion of material between portions of a silver cladding which are in contact with each other during the superconductor oxidation process.

Accordingly, it is an object of the present invention to provide a method and apparatus for heat processing a silver clad superconductor wire which substantially prevents the diffusion of material from the silver cladding of the wire into adjacent segments of silver cladding. It is a further object of the present invention to provide a method and apparatus for heat processing a superconductor wire which permits the wire to be wound onto a spool in juxtaposed coils incident to oxidizing the superconductor. Another object of the present invention is to provide a method and apparatus for heat processing a superconductor wire which is relatively easy and cost-effective to use. A further object of the present invention is to provide a method for heat treating silver clad spooled superconductor wire which will result in wires which are not stuck together and not broken so that the wires may be unspooled as long continuous lengths of high quality superconductor wire.

SUMMARY

In overview, a method for heat processing a high transition temperature (high-$T_c$) superconductor wire which has a protective silver cladding includes depositing a layer of diffusion inhibiting material onto the silver cladding. The wire is then wound around the periphery of a spool in juxtaposed coils, i.e., portions of the silver cladding of the superconductor wire can contact other portions of the silver cladding. The spool and wire are then placed in a furnace and heated as appropriate to oxidize or sinter the superconductor material. Importantly, silver is prevented from diffusing between the juxtaposed portions of the silver-clad wire during the heating process by the layer of diffusion inhibiting material.

The present invention also discloses an apparatus for heat processing a superconductor wire in accordance with the method described above. More particularly, the apparatus includes a base on which is mounted a container that holds a paint comprising a diffusion inhibiting material, preferably a rare earth oxide, and a cellulose-based binder material which are dissolved together in a non-aqueous alcohol-based solution. A vat which also contains the non-aqueous alcohol$ based paint is connected in fluid communication with the container via a pair of fluid lines. A pump is connected to one of the fluid lines between the vat and the container and is operable to circulate the paint between the vat and container. Consequently, the paint in the container can be replenished during the deposition process with paint from the vat. The apparatus also includes a spool rotatably mounted on the base above the container which has a spongy metal mesh positioned on its outer surface to accommodate structural strains which can arise from different thermal expansions of the spool and wire during subsequent oxygenation or sintering processes.

To draw the wire through the container and thereby deposit the paint onto the wire, one end of the wire is attached to the spool, and the spool is rotated to draw the wire through the container. When the paint which is held in the container comes into contact with the wire as the wire is drawn through the container, the paint adheres to the silver cladding. During this process, the paint dries before the wire is wound onto the spool. Consequently, a layer of dried paint is left on the silver cladding of the wire.

Accordingly, as the spool is rotated, successive portions of the wire are drawn sequentially through the paint container and are then wound around the spool into a coiled configuration. In accordance with the description above, the spongy metal mesh is positioned between the coils of superconducting wire and the outer surface of the spool. The spool of superconductor wire can then be placed into a furnace where the superconductor wire is heat processed. A superconductor wire which has been heat processed in accordance with the method described above is also disclosed.

The novel features of this invention, as well as the invention itself, both as to its structure and its operation, will be best understood from the accompanying drawings, taken in conjunction with the accompanying description, in which similar reference characters refer to similar parts, and in which:

BRIEF DESCRIPTION OF THE DRAWINGS

FIG. 1 is a schematic view of the apparatus for depositing a diffusion inhibiting layer onto a protective superconductor wire cladding in accordance with the present invention, with portions shown in phantom for clarity;

FIG. 2 is a cross-sectional view of the superconductor wire product of the present invention, as would be seen along the line 2—2 in FIG. 1;

FIG. 3 is a schematic view of the spooled superconductor wire of the present invention placed inside a furnace, with the furnace shown in phantom for clarity; and FIG. 4 is a block diagram of the novel method for heat processing a superconductor wire in accordance with the present invention.

DESCRIPTION OF THE PREFERRED EMBODIMENT

Referring initially to FIG. 1, an apparatus for processing a superconductor wire is shown and generally designated 10. As shown schematically, apparatus 10 is used to deposit a diffusion bonding inhibitor paint onto a silver-cladded superconductor wire 12. In accordance with the wire which includes a ceramic superconductor material having a superconducting transition temperature above about twenty (20) Kelvins. In the preferred embodiment of wire 12, shown in FIG. 2, superconductor wire 12 includes a metallic substrate 14 which has a diameter 16 of approximately fifty (50) to one hundred fifty (150) microns. The material of substrate 14 is preferably Duranickel 301, or any of the materials listed in the table below:

TABLE 1

| COMPOSITION OF WIRE SUBSTRATES (WEIGHT %) | | | | | | | | | |
|---|---|---|---|---|---|---|---|---|---|
| | Ni | Fe | Cr | Al | Si | Mn | Mg | Ti | Zr | B |
| Duranickel 301 | 94.2 | | | 4.4 | 0.4 | 0.3 | 0.4 | | | |
| Hoskins-875 | | 71.5 | 22.5 | 5.5 | 0.5 | | | | | |
| Alumel | 94.8 | | | 1.5 | 1.5 | 1.7 | | | | |
| Inconel-601 | 60 | 13 | 23 | 1.5 | 0.5 | 1.0 | | | | |
| Haynes 214 | 76.5 | 3 | 16 | 4.5 | | | | | | |
| Nisil | 95.5 | | | | 4.4 | | 0.1 | | | |
| Nicrosil | 84.4 | | 14.2 | | 1.4 | | | | | |
| Ni$_3$Al | 88.1 | | | 11.3 | | | | | .6 | .02 |

Further, substrate 14 can be made of alloys having 3 compositions such as; $Ni_{1-x}Al_x$ ($x \leq 0.25$); $Ni_xAl_yB_z$ ($0.6 \leq x$, $0.1 \leq y \leq 0.25$, and $z \leq 0.1$); and $Ni_xAl_yCu_z$ ($0.6 \leq x$, $y \leq 0.25$, and $z \leq 0.25$).

Superconductor wire 12 is also shown in FIG. 2 to include diffusion barrier 18, which has a thickness 20 of approximately one (1) to twenty (20) microns. Diffusion barrier 18 is any material which is chemically compatible with ceramic superconductor layer 22, and which substantially prevents the diffusion of material from substrate 14 to ceramic layer 22. In the preferred embodiment, diffusion barrier 18 is $NdBa_2Cu_3O_{7-x}$, where x is from 0 to 0.5. Additionally, ceramic superconductor layer 22 is made of $REBa_2Cu_3O_{7-x}$, where RE is selected from the group consisting of yttrium and elements having an atomic number of fifty-seven (57) to seventy-one (71), inclusive, and x is from 0 to 0.5, inclusive. Preferably, superconductor layer 22 is $DyBa_2Cu_3O_{7-x}$, where x is from 0 to 0.5 and has a thickness 24 of approximately fifty (50) to one hundred fifty (150) microns.

Importantly, ceramic superconductor layer 22 is encased in a protective cladding 26, which has a thickness 28 of approximately one (1) to twenty-five (25) microns. In the preferred embodiment, cladding 26 is silver which has been sintered into a dense, coherent protective cladding that substantially prevents the diffusion of water and other impurities (e.g., carbon dioxide) through protective silver cladding 26 to ceramic superconductor layer 22. As is well known in the art, however, silver cladding 26 does not substantially prevent the elevated temperature diffusion of oxygen through cladding 26 to superconductor layer 22. The method by which diffusion barrier 18, superconductor layer 22, and silver cladding 26 are deposited onto substrate 14 is disclosed in co-pending U.S. patent application Ser. No. 581,450, entitled "Process and Apparatus for Fabrication of Silver Coated High Temperature Ceramic Superconductor" and assigned to the same assignee as the present invention. It is to be understood that substrate 14, with diffusion barrier 18, superconductor layer 22, and silver cladding 26 is the preferred starting wire 11 material (shown in FIG. 1) for the method for depositing a diffusion inhibiting layer onto silver-clad superconductor wire of the present invention. Thus, for clarity of disclosure, the superconductor wire without diffusion inhibiting layer 30 will be designated starter wire 11, while the superconductor wire with diffusion inhibiting layer 30 will be designated 12.

FIG. 2 shows that after the diffusion inhibiting layer deposition step of the present invention, but before wire 12 is heated, wire 12 also includes a diffusion inhibiting layer 30, which has a thickness 32 of approximately ten to thirty (10-30) microns. Thus, diffusion inhibiting layer 30 in FIG. 2 consists of a diffusion inhibiting material, a binder material, and excess solvent which has not dried. More specifically, diffusion inhibiting layer 30 includes a diffusion inhibiting material which is chemically compatible with silver cladding 26, and which substantially prevents the diffusion of silver through diffusion inhibiting layer 30 when silver cladding 26 is heated. In the preferred embodiment, the diffusion inhibiting material of layer 30 is a ceramic, preferably yttria or a rare earth oxide. Alternatively, diffusion inhibiting layer 30 can be zirconia or boron nitride, or other appropriate material that does not chemically react with silver at the subsequent elevated temperatures to which the material will be subjected. For example, the diffusion inhibiting material of layer 30 could be neodymium oxide, which is blue, or praseodymium oxide, which is black. It will be appreciated that the use of a non-white diffusion inhibiting material facilitates visual inspection of layer 30 against the substantially white background of the silver cladding 26.

Returning to FIG. 1, apparatus 10 is shown to include a base 33 on which a container 34 is mounted. A wire supply spool 35 which supplies the preferred starting wire material 11 is rotatably mounted on base 33. As shown, wire 11 can be positioned in container 34. To permit continuously drawing starting wire 11 through container 34, container 34 can be formed with a leak-proof diaphragm 36, shown in phantom in FIG. 1. As further shown in FIG. 1, container 34 holds a liquid paint 38. Paint 38 is a non-aqueous solution in which the material that is to form diffusion inhibiting layer 30 is dissolved. In the preferred embodiment, paint 38 includes a non-aqueous solvent, e.g., isopropanol, octanol, or diglyme ether/alcohol solution, and a suitable ceramic diffusion inhibiting material (e.g., yttria, rare earth oxide, zirconia, boron nitride). Also, paint 38 includes a suitable binder material, e.g. a cellulose-based binder, to more firmly adhere the diffusion inhibiting material to silver cladding 26. Such a paint is commercially available from ZYP Coatings Inc. as type YK yttrium oxide paint.

FIG. 1 also shows that container 34 is connected in fluid communication with a vat 40 through lines 42, 44. Vat 40 also holds paint 38. Paint 38 can be circulated between vat 40 and container 34 through lines 42, 44 by a pump 46. Accordingly, paint 38 in container 34 is continually replenished from vat 40. Also, to prevent sedimentation of the material suspended in vat 40, a magnetic stirrer 40, which is positioned externally to vat 40 causes magnetic stir bar 50, shown in phantom as being immersed in the vat 40, to rotate and thereby stir and mix paint 38.

FIG. 1 also shows that wire 12 is wound around a spool 60, which is removably rotatably mounted on base 33. It is to be appreciated that relatively long production lengths of wire 12 can be positioned on spool 60, e.g., upwards of five thousand (5000) meters of wire 12 can be wound onto spool 60. Spool 60 is made of a suitable metal, e.g., steel, aluminum, or inconel, that can withstand the elevated temperatures required for processing the appropriate superconductor material. As schematically shown in FIG. 1, spool 60 has a spongy metal mesh 62 positioned on the outer surface 64 of spool 60. Metal mesh 62 is positioned between wire 12 and outer surface 64 of spool 60 to cushion wire 12 during the heat processing method described below. Stated differently, spongy metal mesh 62 absorbs thermally-induced dimensional changes of both wire 12 and spool 60, to prevent undesired stretching of wire 12 and the consequent potential breaking of wire 12 as spool 60 expands during the heat processing of wire 12. In the preferred embodiment, spongy metal mesh 62 is a mesh made of 304 stainless steel fiber which has a fiber diameter of about eight (8) microns and which is marketed as "needle punched web" by the Technetics Corporation.

Importantly, FIG. 1 shows that wire 12 is wound around spool 60 in a juxtaposed spooled configuration in a plurality of coils 70. More specifically, taking juxtaposed coils 70a, 70b as examples, coils 70a, 70b contact each other at a point 72. Although not shown in FIG. 1, coils 70a, 70b can contact each other at other points in addition to point 72. Moreover, it is to be appreciated that while FIG. 1 shows that coils 70a, 70b are in lateral contact with each other with respect to arrow 68, coils 70a, 70b can also overlap each other.

Finally, FIG. 3 shows that spool 60 can be positioned in a furnace 74. Furnace 74 is any suitable device which can heat wire 12 to a temperature which is sufficient for the particular heat treatment of wire 12. As schematically shown in FIG. 3, a vacuum pump 59 is connected in fluid communication with furnace 74 via a line 61 for the purpose of evacuating the interior of furnace 74. Also, a source 63 of oxygen is connected in fluid communication to furnace 74 via line 65. A pressure regulator 67 can be attached to line 65 to regulate the pressure of oxygen within furnace 74. Additionally, for reasons to be shortly disclosed, FIG. 3 shows that after wire 12 has been wound onto spool 60, spool 60 is removed from apparatus 10 and placed inside furnace 74. Importantly, as shown in FIG. 3, spool 60 is oriented in furnace 74 with axis 66 of spool 60 substantially horizontal to the direction of the force of gravity on spool 60, represented by arrow 68.

METHOD OF MANUFACTURE

In describing the method of manufacture in accordance with the present invention, cross-reference is made to FIGS. 1 and 4. As indicated at block 76 in FIG. 4, starter wire 11 is positioned through container 34 and attached to spool 60. Importantly, metal mesh 62 is disposed between wire 11 and outer surface 64 of spool 60. Then, as indicated at block 78, spool 60 is rotated about axis 66 to draw wire 11 through container 34, and around spool 60.

As wire 12 (i.e., wire after layer 30 has been deposited thereon) is being wound around spool 60, as indicated at block 80 of FIG. 4, paint 38 is deposited onto those portions of starter wire 11 which are drawn through container 34. More specifically, the binder material included in paint 38 causes the diffusion inhibiting material in paint 38 to adhere to silver cladding 26 of wire 11 as wire 11 is drawn through container 34 to thereby establish wire 12. Furthermore, as indicated at block 84, those portions of wire 12 which have been drawn through container 34 are wound onto spool 60. Also, as indicated at block 82, portions of the excess solvent from paint 38 which have adhered to silver cladding 26 of wire 12 evaporate off of those portions of wire 12 which pass between container 38 and spool 60.

After wire 12 has been wound onto spool 60 in the juxtaposed, coiled configuration shown in FIG. 1, spool 60 (and, hence, wire 12) are placed into furnace 74, shown in FIG. 3. Furnace 74 is energized to heat wire 12 to a predetermined temperature for a predetermined time. More specifically, as indicated at block 86 of FIG. 4, wire 12 heated to approximately two hundred degrees centigrade (200° C.) at a heat up rate of about one degree per minute (1°/min). By so heating wire 12, excess solvent from paint 38 is evaporated from silver cladding 26. Importantly, during this solvent evaporation process, the pressure within furnace 74 is maintained at or near a vacuum by appropriately activating vacuum pump 59 to evacuate furnace 74 to avoid build up of excess solvent vapor pressure which might ignite.

If desired, a partial pressure of oxygen can be established in furnace 74 during the solvent evaporation process. To this end, pressure regulator 67 passes oxygen from oxygen source 63 into furnace 74, to establish the predetermined partial pressure of oxygen. In any case, after wire 12 has been heated to about two hundred degrees centigrade (200° C.), a predetermined partial pressure of oxygen of a few torr is established within furnace 74. Then, wire 12 is heated in furnace 74 to about four hundred degrees centigrade (400° C.) at a heat up rate of about one degree per minute to bake off excess binder material from paint 38. As is well known to those skilled in the art, the binder material of paint 38, which combusts at a temperature of between two hundred degrees centigrade (200° C.) and three hundred fifty degrees centigrade (350° C.), reacts with the oxygen within furnace 74 to form carbon dioxide gas. The $CO_2$ gas is evacuated from furnace 74 by vacuum pump 59. Consequently, after excess solvent and binder material from paint 38 has been removed as disclosed, a layer 30 of diffusion inhibiting material is left as a residue on silver cladding 26. Furnace 74 then heats wire 12 in an oxygen atmosphere to establish an optimum oxygen content in superconductor layer 22. This step is indicated at block 88 in FIG. 4. When superconductor layer 22 is made of a rare earth-based superconductor material having the chemical formula $REBa_2Cu_3O_{7-x}$, furnace 74 heats wire 12 to a temperature in the range of three hundred fifty to five hundred fifty degrees centigrade (350° C.-550° C.) for a period in the range of one (1) hour to one (1) week. Preferably, furnace 74 heats wire 12 to about four hundred degrees centigrade (400° C.) for approximately one (1) day.

Importantly, as wire 12 is heated to oxygenate superconductor layer 22, silver material from those portions of wire 12 which are juxtaposed with other portions of wire 12 do not diffuse through diffusion inhibitor layer 30. As an example, substantially no silver in the silver cladding 26 of coil 70a diffuses through the diffusion inhibiting layer 30 of coil 70a into the silver cladding 26 of coil 70b. Likewise, when wire 12 is heated in furnace 74, substantially no silver in the silver cladding 26 of coil 70b diffuses through the diffusion inhibiting layer 30 of coil 70b into the silver cladding 26 of coil 70a. Silver does not diffuse between the coils 70a and 70b even at point 72, wherein the coils 70a, 70b contact each other.

Also, it will be recalled that spool 60 is oriented horizontally with respect to the direction of the force of gravity within furnace 60. Consequently, as the diameters of coils 70 and spool 60 respectively expand at potentially different rates because the materials of wire 12 and spool 60 can potentially have respectively different thermal expansion coefficients, each of the coils 70 remains at substantially the same axial position relative to spool 60 during the heating process. In other words, coils 70 do not droop onto each other as the coils 70 potentially become slack around spool 60 during the heat processing step.

Finally, it will be appreciated that as the coils 70 of wire 12 are heated in furnace 74, the coils 70 are not unduly stressed, even in the case wherein spool 60 thermally expands at a greater rate than wire 12. This is because spongy metal mesh 62 absorbs the expansion of spool 60, as disclosed above. The spongy metal mesh 62 also minimizes the slack that can occur as discussed above.

While the disclosure above focuses on heat processing a rare earth-based superconductor wire to oxygenate the superconductor material, it is to be understood that the method and apparatus of the present invention can be used in other superconductor heat processing applications. For example, in the case of a superconductor wire which includes a bismuth-based ceramic superconductor material, the present invention can be used to sinter the silver-clad bismuth-based superconductor. For such an application, a layer of diffusion inhibiting material is deposited onto the bismuth-based superconductor wire, according to the method disclosed above. Then, furnace 74 heats the bismuth-based superconductor wire to a temperature of approximately nine hundred degrees centigrade (900° C.) for approximately one hundred (100) hours, to sinter the bismuth-based superconductor material.

While the particular process for non-destructive heat treatment of spooled silver coated high temperature superconductors as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

I claim:

1. A method for heat treating a high transition temperature superconductor wire having a ceramic superconductor material and a protective noble metal cladding surrounding said ceramic superconductor material, which comprises the steps of:

depositing a diffusion inhibitor material selected from the group consisting of a rare earth oxide, zirconium oxide, and boron nitride, and combinations thereof, in a dispersed state on the exterior surface of said protective cladding, said diffusion inhibitor material substantially covering said exterior surface and adhering thereto to form a diffusion inhibiting layer thereon substantially inert with said cladding and substantially preventing diffusion of said cladding across said layer;

winding said wire around the periphery of a spool to form a coil having a plurality of wire overlaps contacting one another, wherein contact of said overlaps is provided by said diffusion inhibitor material, thereby substantially preventing contact of said cladding at said overlaps; and heating said wire on said spool to a predetermined temperature for a predetermined time to heat process said superconductor wire while said layer substantially prevents diffusion of said cladding between said overlaps and further substantially prevents adherence of said wire together at said overlaps.

2. The method of claim 1 wherein said depositing step is accomplished by drawing said wire through a container, said container holding a solution of said diffusion inhibitor material suspended in a non-aqueous solvent.

3. The method of claim 1 wherein said superconductor material has the chemical equation $REBa_2Cu_3O_{7-x}$, wherein RE is an element selected from the group consisting of yttrium and elements having an atomic number between 57 and 71, inclusive, and combinations thereof, and said wire superconductor is heated in an oxygen-containing atmosphere to oxygenate said superconductor material with oxygen passing across said layer and said cladding from said atmosphere.

4. The method of claim 3 wherein said predetermined temperature is in the range of approximately three hundred fifty to five hundred degrees centigrade (350°-500° C.) and said predetermined time is in the range of one hour to one week, and said superconductor wire is heated t establish a predetermined oxygen content of X between 0 and approximately 0.2 in said superconductor material.

5. The method of claim 1 wherein said diffusion inhibitor material is a rare earth oxide.

6. The method of claim 1 wherein said diffusion inhibitor material is yttria.

7. The method of claim 2 wherein said solution includes a binder material for adhering said diffusion inhibitor material to said cladding.

8. The method of claim 1 further comprising the step of disposing a metallic mesh between said periphery of said spool and said wire coil.

9. The method of claim 1 wherein said superconductor material is a bismuth-based superconductor material and said predetermined temperature is approximately nine hundred degrees centigrade (900° C.), said predetermined time is approximately one hundred (100) hours, and said superconductor material is sintered during said heating step.

10. The method of claim 1 wherein said protective cladding comprises silver.

11. A method for heat processing a superconductor wire having a ceramic superconductor material and a protective noble metal cladding surrounding said ceramic superconductor material, comprising the steps of:

depositing a diffusion inhibiting paint having a diffusion inhibiting material selected from the group consisting of a rare earth oxide, zirconium oxide, and boron nitride, and combinations thereof, dispersed therein onto the exterior surface of said cladding, said paint substantially covering said exterior surface and adhering thereto to form a diffusion inhibiting layer thereon substantially inert with said cladding and substantially preventing diffusion of said cladding across said layer;

spooling said wire to form a spooled wire having a plurality of wire overlaps contacting one another, wherein contact of said overlaps is provided by said paint, thereby substantially preventing contact of said cladding at said overlaps; and heating said spooled wire to a predetermined temperature for a predetermined time to heat process said superconductor, wherein said paint substantially inhibits diffusion of said cladding through said paint at said overlaps and further substantially prevents adherence of said wire together at said overlaps.

12. The method of claim 11 wherein said spooling step is accomplished by winding said wire around the periphery of a spool and positioning a metal mesh between said periphery of said spool and said wire, and said depositing step is accomplished by drawing said wire through a container, said container holding said paint, said paint including a non-aqueous solvent and said diffusion inhibiting material.

13. The method of claim 11 wherein said superconductor material has the chemical equation $REBa_2Cu_3O_{7-x}$, wherein RE is an element selected from the group consisting of yttrium and elements having an atomic number between 57 and 71, inclusive, and combinations thereof, and said heating step is accomplished to oxygenate said superconductor material.

14. The method of claim 11 wherein said predetermined temperature is in the range of approximately three hundred fifty to five hundred degrees centigrade (350°-14 500° C.) and said predetermined time is in the range of one hour to one week, and said superconductor wire is heated to establish a predetermined oxygen content in said superconductor layer.

15. The method of claim 12 wherein said diffusion inhibiting material is yttria.

16. The method of claim 12 wherein said paint further comprises a binder material dissolved in said non-aqueous solvent.

17. The method of claim 11 wherein said superconductor material is a bismuth-based superconductor material and said predetermined temperature is approximately nine hundred degrees centigrade (900° C.) and said predetermined time is approximately one hundred (100) hours, and said heating step is accomplished to sinter said superconductor material.

* * * * *